(12) United States Patent
Furukawa (10) Patent No.: US 8,164,244 B2
(45) Date of Patent: Apr. 24, 2012

(54) LIGHT EMITTING DEVICE

(75) Inventor: Chisato Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,789

(22) Filed: Mar. 21, 2011

(65) Prior Publication Data

US 2012/0019123 A1     Jan. 26, 2012

(30) Foreign Application Priority Data

Jul. 22, 2010   (JP) .................................. 2010-164876

(51) Int. Cl.
*H01J 1/62* (2006.01)
(52) U.S. Cl. ............................ 313/483; 313/512; 257/98
(58) Field of Classification Search .................. 313/512, 313/483, 498; 257/79, 98
See application file for complete search history.

(56) References Cited

U.S. PATENT DOCUMENTS

6,936,852 B2    8/2005   Furukawa et al.

*Primary Examiner* — Joseph L Williams
(74) *Attorney, Agent, or Firm* — Finnegan, Henderson, Farabow, Garrett & Dunner, L.L.P.

(57) ABSTRACT

According to one embodiment, a light emitting device includes a light emitting element, a molded body, a first sealing layer, and a converging lens. The light emitting element has a first surface and a second surface opposite to the first surface, with an optical axis of emission light being perpendicular to the second surface. The molded body includes a recess. The first surface side of the light emitting element is disposed in the recess. The first sealing layer covers the light emitting element in the recess and includes a first transparent resin and phosphor particles. The converging lens is provided on an upper surface of the first sealing layer and has a refractive index increasing with increase of distance from the optical axis. The refractive index at a position in contact with an outer edge of the upper surface of the first sealing layer is higher than a refractive index of the first transparent resin.

20 Claims, 8 Drawing Sheets

LIGHT EMITTING DEVICE

CROSS-REFERENCE TO RELATED APPLICATIONS

This application is based upon and claims the benefit of priority from the prior Japanese Patent Application No. 2010-164876, filed on Jul. 22, 2010; the entire contents of which are incorporated herein by reference.

FIELD

Embodiments described herein relate generally to a light emitting device.

BACKGROUND

Emission light from a light emitting element can be mixed with wavelength converted light emitted from phosphors having absorbed part of the emission light to obtain e.g. white light as a mixed color.

In this case, the directional characteristics of the emission light from the light emitting element are generally different from the directional characteristics of the wavelength converted light.

Thus, for instance, if the mixed color near the optical axis of the light emitting element is set to within a prescribed chromaticity range, the chromaticity may be shifted from the prescribed range in an oblique light outgoing direction away from the optical axis. In particular, this chromaticity shift may be enhanced in a light emitting device provided with a converging lens having a central axis generally matched with the optical axis.

BRIEF DESCRIPTION OF THE DRAWINGS

FIGS. 2A to 2C are process sectional views of a manufacturing method of the light emitting device according to the first embodiment, where

DETAILED DESCRIPTION

In general, according to one embodiment, a light emitting device includes a light emitting element, a molded body, a first sealing layer, and a converging lens. The light emitting element has a first surface and a second surface opposite to the first surface, with an optical axis of emission light being perpendicular to the second surface. The molded body includes a recess. The first surface side of the light emitting element is disposed in the recess. The first sealing layer covers the light emitting element in the recess and includes a first transparent resin and phosphor particles. The converging lens is provided on an upper surface of the first sealing layer and has a refractive index increasing with increase of distance from the optical axis. The refractive index at a position in contact with an outer edge of the upper surface of the first sealing layer is higher than a refractive index of the first transparent resin.

Embodiments of the invention will now be described with reference to the drawings.

Figure 1A:
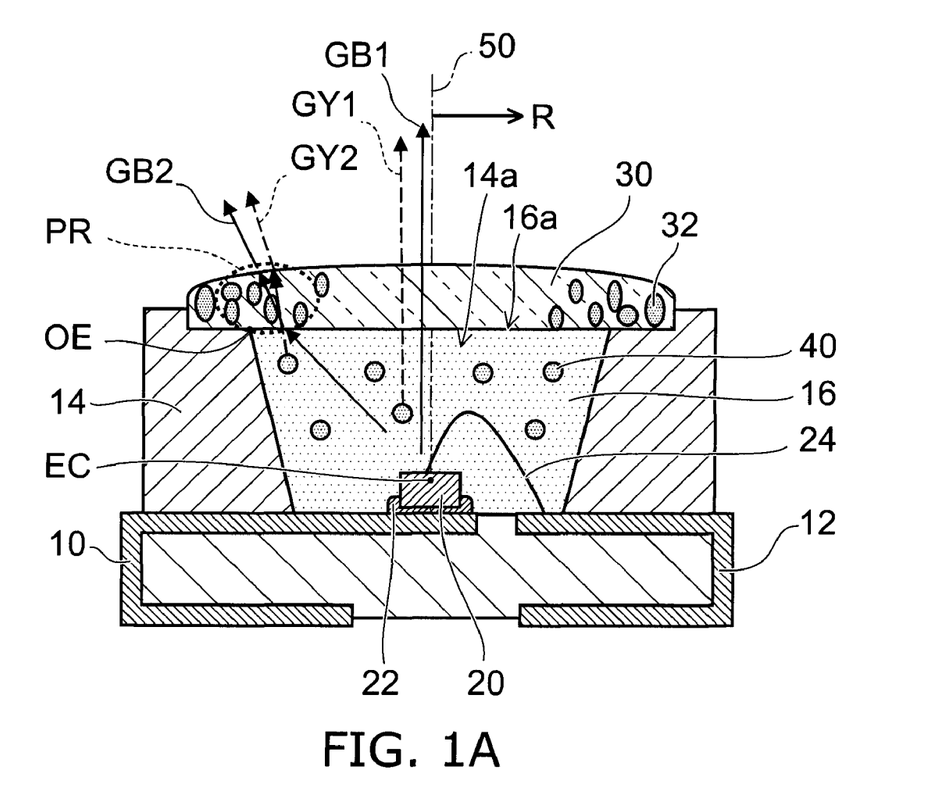
FIG. 1A is a schematic cross-sectional view of a light emitting device according to a first embodiment.
Figure 1B:
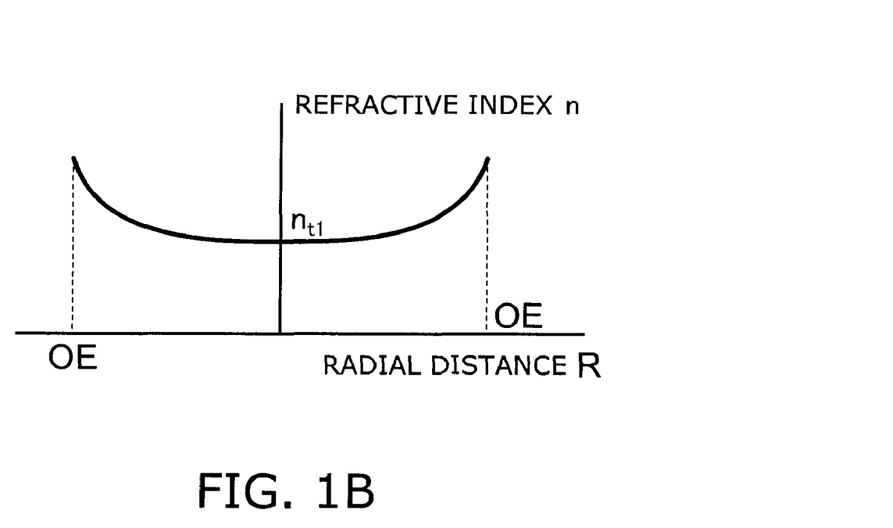
FIG. 1B is a graph showing the dependence of a refractive index on the radial distance.

FIG. 1A is a schematic cross-sectional view of a light emitting device according to a first embodiment. FIG. 1B is a graph showing the dependence of refractive index on the radial distance.

The light emitting device includes a first lead 10, a second lead 12, a molded body 14 made of resin, a light emitting element 20 provided on the first lead 10, a first sealing layer 16 provided in a recess 14a of the molded body 14 and including a first transparent resin, phosphor particles 40 dispersed in the first sealing layer 16, and a converging lens 30 covering the first sealing layer 16.

The term "transparent resin" used herein refers to a resin translucent to emission light from the light emitting element. The transmittance for the emission light does not necessarily need to be 100%. That is, it is assumed that the resin having a nonzero transmittance for the emission light is included in the "transparent resin".

A large number of pairs of the first lead 10 and the second lead 12 are connected to a lead frame made of a copper-based or iron-based material. Its thickness can be set to e.g. 0.15 to 0.4 mm.

The molded body 14 can be made of a nylon-based thermoplastic resin such as PPA (polyphthalamide), or epoxy-based thermosetting resin. The first sealing layer 16 can be made of e.g. silicone or epoxy. The first lead 10 and the second lead 12 can be integrally shaped with the molded body 14.

The first surface of the light emitting element 20 is bonded onto the first lead 10 with e.g. an adhesive 22. An upper electrode is provided on the second surface of the light emitting element 20 opposite from the first surface. The upper electrode is connected to one end of the second lead 12 by a bonding wire 24.

The phosphor particles 40 are dispersed in the first sealing layer 16. Depending on the wavelength and optical output of the emission light from the light emitting element 20, the kind, composition, weight ratio and the like of the phosphor particles 40 can be selected to obtain mixed light in a desired chromaticity range.

Furthermore, a converging lens 30 is disposed on the upper surface of the molded body 14 and the upper surface 16a of the first sealing layer 16. The central axis of the converging lens 30 is generally matched with the optical axis 50 of the emission light. The optical axis 50 is perpendicular to the second surface of the light emitting element 20.

In the embodiment, as shown in FIG. 1B, the converging lens 30 has a refractive index n increasing with the increase of the radial distance R from the optical axis 50. The refractive index n is set to be more than or equal to the refractive index $n_{r1}$ of the first transparent resin at the position OE on the outer edge of the upper surface of the first sealing layer 16.

Here, the light emitting element 20 is made of a material of $In_xGa_yAl_{1-x-y}N$ ($0 \leq x \leq 1$, $0 \leq y \leq 1$, $x+y \leq 1$). Its emission wavelength is set to within the range from ultraviolet to green light. In this case, the phosphor particle 40 absorbing blue light is made of e.g. a silicate-based material, and can emit yellow light as wavelength converted light. Here, the material of the light emitting element 20, its emission wavelength, and the material of the phosphor particle 40 are not limited thereto. For instance, for emission light in the ultraviolet light wavelength range, white light can be obtained also by generating wavelength converted light with three colors using red, blue, and green phosphor particles.

The first sealing layer 16 includes e.g. silicone having a refractive index of 1.4. The converging lens 30 includes e.g. a translucent material such as transparent resin and glass, and fillers 32 dispersed inside this material. The filler 32 has a refractive index higher than the refractive index $n_{t1}$ of the first transparent resin.

In the case where the converging lens 30 is made of a second transparent resin, its refractive index is made higher than the refractive index $n_{t1}$ of the first transparent resin. This is preferable because the outgoing light from the first sealing layer 16 is then injected into the converging lens 30 without undergoing total reflection. In this case, preferably, the filler 32 has a higher refractive index than the second transparent resin.

In the converging lens 30, the fillers 32 are arranged so that the weight composition ratio thereof increases with the increase of the radial distance R. By mixing the fillers having a high refractive index, the refractive index n of the converging lens 30 can be distributed so as to increase in the peripheral region PR of the converging lens 30 as shown in FIG. 1B.

The filler 32 is translucent to the emission light from the light emitting element 20. The filler 32 can be made of a material such as zirconium dioxide (refractive index 2.4), titanium oxide (refractive index 2.8), and potassium titanate (refractive index 2.7). The shape of the filler 32 is e.g. a sphere, ellipsoid, ribbon, or thin line. Its size can be set to e.g. 50 μm or less. If the first sealing layer 16 is made of silicone, its refractive index is generally 1.4.

If small-size fillers 32 are dispersed, the traveling direction of light variously changes near the individual fillers 32. However, in the region dispersed with numerous fillers 32 as a whole, refraction is enhanced in accordance with the weight composition ratio. That is, refraction is larger in the region with a high weight composition ratio of the fillers 32 than in the region with a low weight composition ratio. The dependence of refractive index on the weight composition ratio of the fillers 32 can be determined by e.g. experiments or simulations.

Figure 2A:
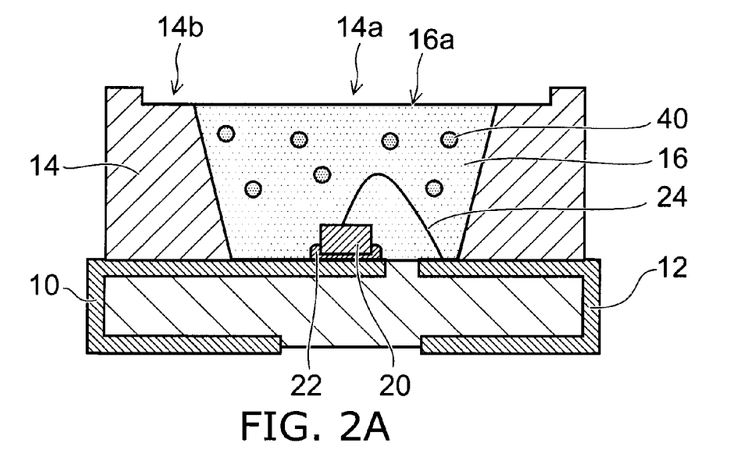
FIG. 2A is a schematic view with the coated transparent resin.
Figure 2B:
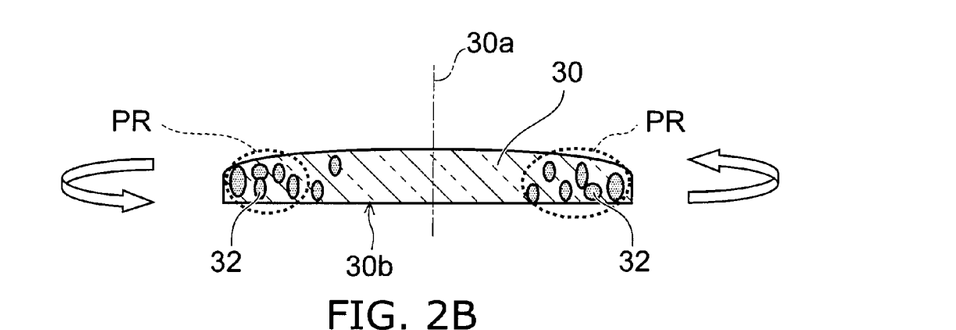
FIG. 2B is a schematic view of the converging lens.
Figure 2C:
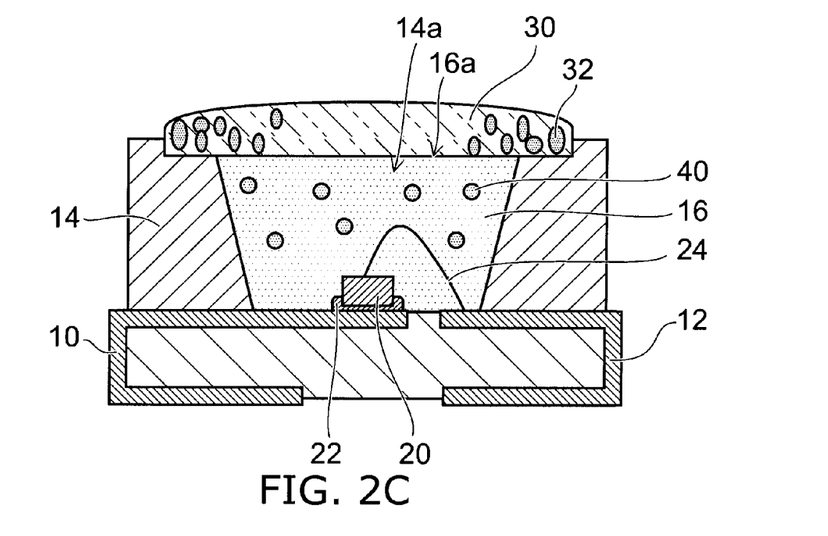
FIG. 2C is a schematic view after assembly.

FIGS. 2A to 2C are process sectional views of a manufacturing method of the first embodiment. More specifically, FIG. 2A is a schematic view with the coated transparent resin. FIG. 2B is a schematic view of the converging lens. FIG. 2C is a schematic view after assembly.

As shown in FIG. 2A, a recess 14a is formed in the molded body 14. One end of the first lead 10 and one end of the second lead 12 are exposed at the bottom surface of the recess 14a. The light emitting element 20 is bonded onto the first lead 10 with an adhesive 22 made of e.g. metal solder or conductive adhesive. After wire bonding, a first transparent resin solution mixed with phosphor particles 40 is filled in the recess 14a.

On the other hand, a second transparent resin in liquid form mixed with fillers 32 is injected into e.g. a mold and rotated about the central axis 30a. The fillers 32 having a larger specific weight than the second transparent resin can be collected in the peripheral region by rotation. The sedimentation rate of the fillers 32 in the second transparent resin under the centrifugal force depends on e.g. the specific weight, size, and shape of the filler 32 and the viscosity of the liquid resin. According to the inventor's experiments, it has turned out that the fillers 32 having a large specific weight and size are collected at the outside by e.g. the centrifugal force due to rotation. That is, by appropriately selecting the rotation condition, the fillers 32 can be easily dispersed more in the peripheral region PR as shown in FIG. 2B.

Furthermore, as shown in FIG. 2C, a converging lens 30 is located on the upper surface 16a of the first sealing layer 16. In this case, the first sealing layer 16 is semi-cured. Then, the lower surface 30b of the converging lens 30 and the upper surface 16a of the first sealing layer 16 can be brought into close contact without producing a gap at the interface therebetween. Furthermore, a cutaway portion 14b can be provided in the molded body 14. The converging lens 30 can be fitted in the cutaway portion 14b, and swaged or bonded with adhesive. This can further increase the adhesion strength.

Figure 3:
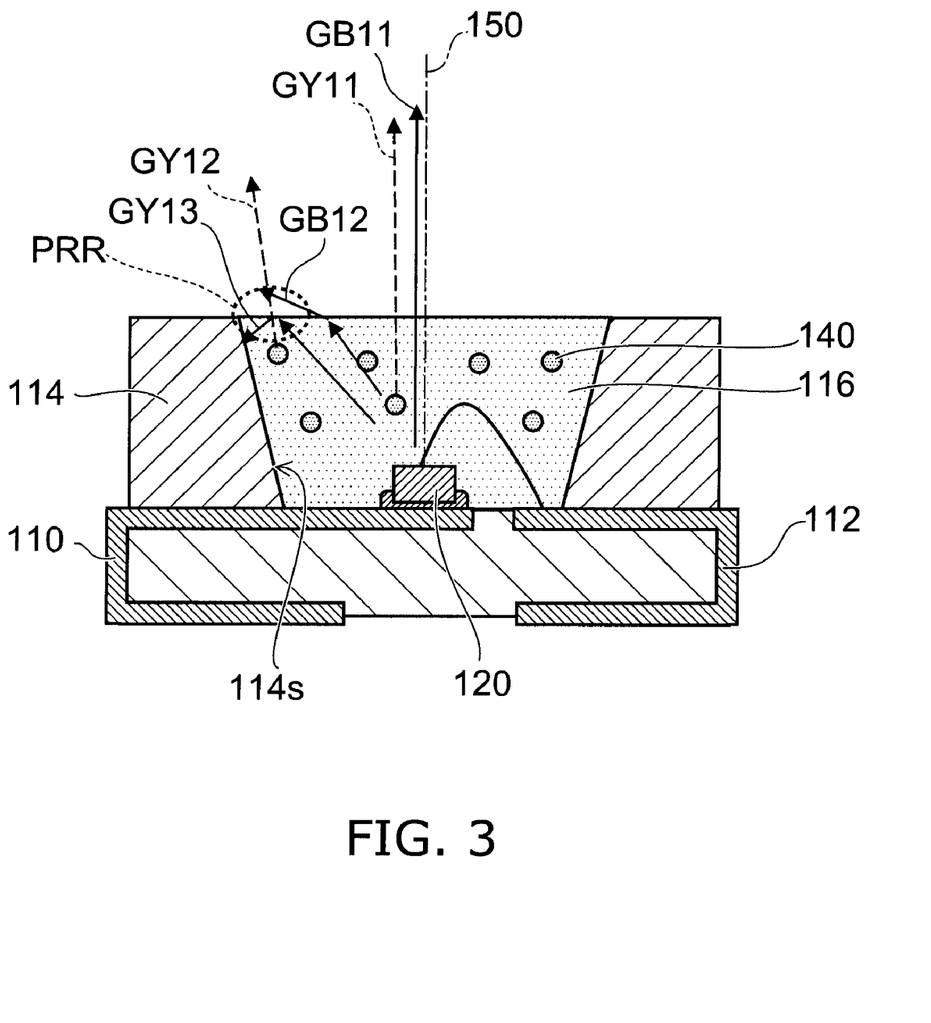
FIG. 3 is a schematic cross-sectional view of a light emitting device according to a comparative example.

FIG. 3 is a schematic cross-sectional view of a light emitting device according to a comparative example.

Depending on the wavelength of blue light from the light emitting element 120, the average size, required weight and the like of yellow phosphor particles 140 are determined. In this case, in the peripheral region PRR of the recess 114a where the intersection angle with the optical axis 150 is large, the optical intensity of blue light GB12 decreases, and the blue light GB12 travels in a direction away from the optical axis 150.

Furthermore, in the case where the outside is an air layer, the critical angle for total reflection is 42 degrees. Hence, blue light GB13 having an incident angle larger than the critical angle cannot be emitted to the outside, but is injected into the sidewall 114s of the molded body 114, for instance. On the other hand, the yellow phosphor particles 140 are widely dispersed in the recess 114a. Yellow light GY12 has a component in a direction parallel to the optical axis 150 upward from the sealing layer 116. Thus, yellowish white light is likely to be emitted from the peripheral region PRR of the sealing layer 116 in a direction away from the optical axis 150.

In contrast, in the embodiment, as shown in FIG. 1A, the refractive index n of the converging lens 30 in the peripheral region RR can be made higher than the refractive index, 1.4, of the first sealing layer 16. Thus, at the interface of the first sealing layer 16 and the converging lens 30, blue light GB2 is bent toward the optical axis 50, and wasteful outgoing light is reduced. The light GY2 once introduced into the converging lens 30 is converged by the lens surface and can be extracted effectively. That is, the outgoing direction of the blue light GB2 and the outgoing direction of the yellow light GY2 are made close. This reduces the chromaticity shift of the emission light from the peripheral region RR. Thus, the chromaticity of the emission light from the peripheral region RR is easily made close to the chromaticity of the mixed light of blue light GB1 and yellow light GY1 near the optical axis 50.

Here, the chromaticity shift in the peripheral region can be reduced also by using a converging lens made of e.g. zirconium dioxide or titanium oxide. However, the process of forming a lens by dispersing high refractive index fillers in a liquid transparent resin or glass can easily manufacture a lens of a desired shape with high volume productivity. As a result, the cost can be reduced.

Figure 4A:
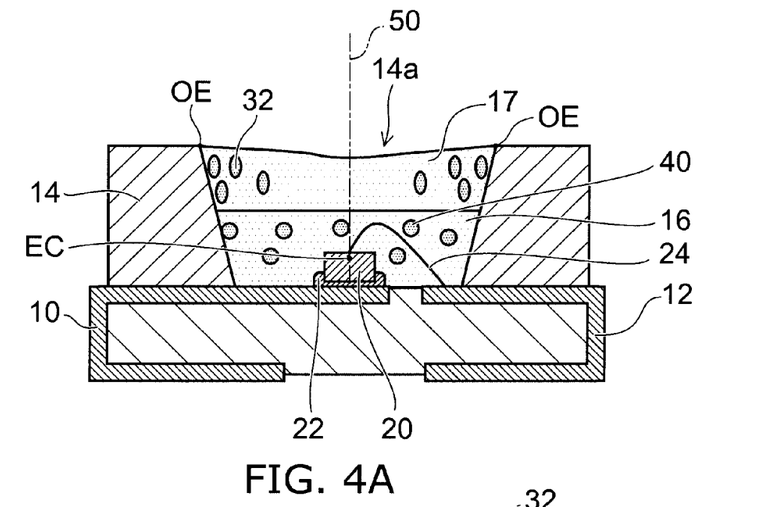
FIG. 4A is a schematic cross-sectional view of a light emitting device according to a second embodiment.
Figure 4B:
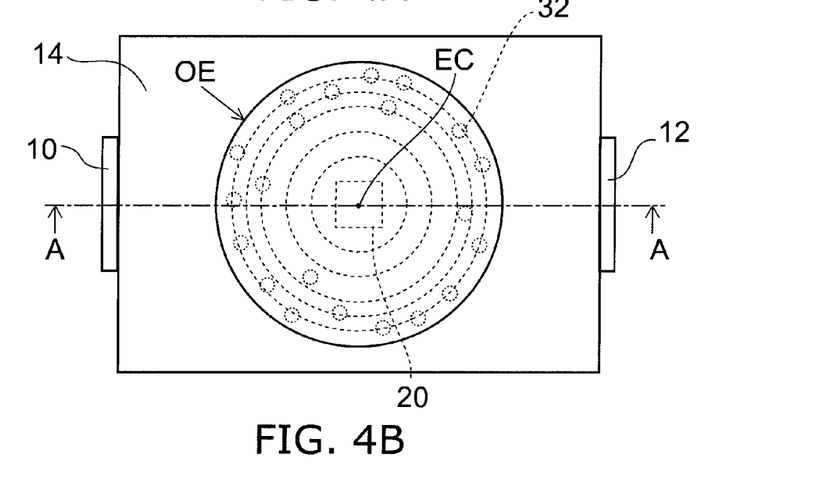
FIG. 4B is a schematic plan view.
Figure 4C:
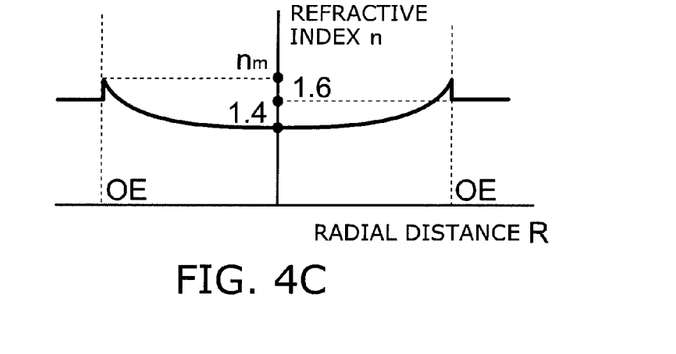
FIG. 4C is a refractive index profile of the sealing layer surface taken along A-A.

FIG. 4A is a schematic cross-sectional view of a light emitting device according to a second embodiment. FIG. 4B is a schematic plan view. FIG. 4C is a refractive index profile of the sealing layer surface taken along A-A.

In the recess 14a of the molded body 14, a first sealing layer 16 is provided so as to cover the light emitting element 20 and the bonding wire 24. The first sealing layer 16 is dispersed with phosphor particles 40. Furthermore, in the recess 14a, a second sealing layer 17 including a third transparent resin is provided on the first sealing layer 16. The second sealing layer 17 is dispersed with fillers 32. The third transparent resin may be the same as the first transparent resin and can be e.g. silicone. The refractive index of the filler 32 is made higher than the refractive index of the third transparent resin.

The weight composition ratio of the fillers 32 can be increased with the increase of the distance R from the optical axis 50. Hence, as shown in FIG. 4C, the effective refractive index of the surface of the second sealing layer 17 increases with the increase of the distance R from the optical axis 50. The effective refractive index can be distributed so that at the outer edge OE of the upper surface of the second sealing layer 17, the effective refractive index reaches a maximum refractive index $n_m$ higher than the refractive index, 1.6, of the molded body 14. More preferably, the refractive index of the third transparent resin is set to be more than or equal to the refractive index $n_{t1}$ of the first transparent resin. This is because total reflection at the interface therebetween can be suppressed.

Figure 5:
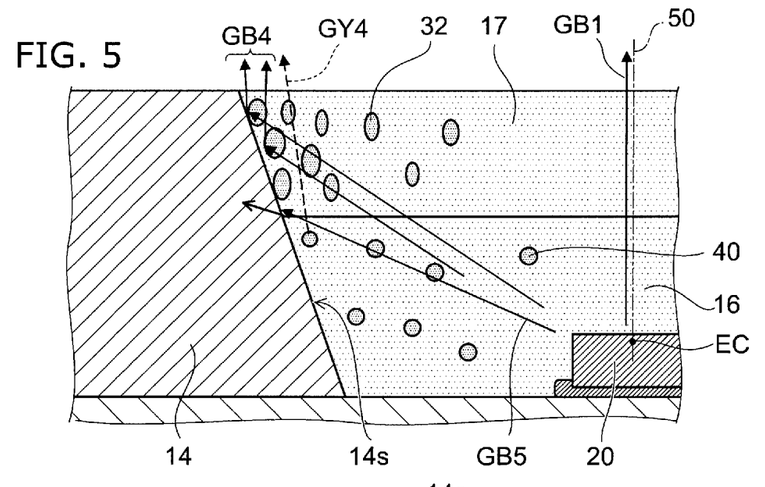
FIG. 5 is a schematic view illustrating the function of a second sealing layer.

FIG. 5 is a schematic view illustrating the function of such a second sealing layer.

The refractive index of the second sealing layer 17 is higher than the refractive index of the molded body 14 on the side in contact with the beveled sidewall 14s of the molded body 14. The molded body 14 is dispersed with reflective fillers of e.g. glass fiber or metal powder made of aluminum. If the molded body 14 has a higher refractive index than the sealing layer, light travels into the region near the beveled sidewall 14s. This decreases the amount of blue light which can be extracted upward. However, in the region of the second sealing layer 17 adjacent to the beveled sidewall 14s, the refractive index can be made higher than the refractive index of the molded body 14. This facilitates increasing the blue light GB4 totally reflected near the beveled sidewall 14s. Consequently, the ratio of wavelength converted light GY4 from phosphor particles 40 dispersed in the first sealing layer 16 to the blue light GB4 can be made close to a prescribed ratio. Thus, the chromaticity shift can be reduced.

Figure 6A:
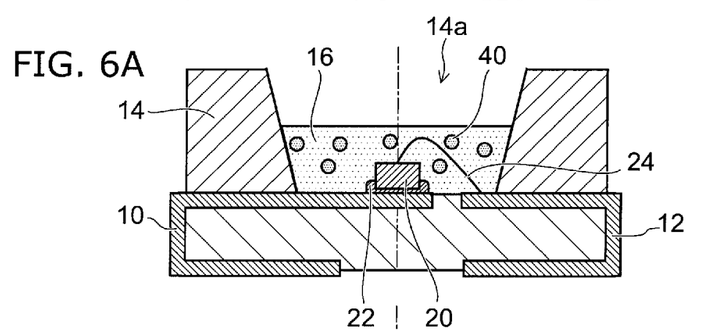
FIG. 6A is a schematic view of forming a first sealing layer.
Figure 6B:
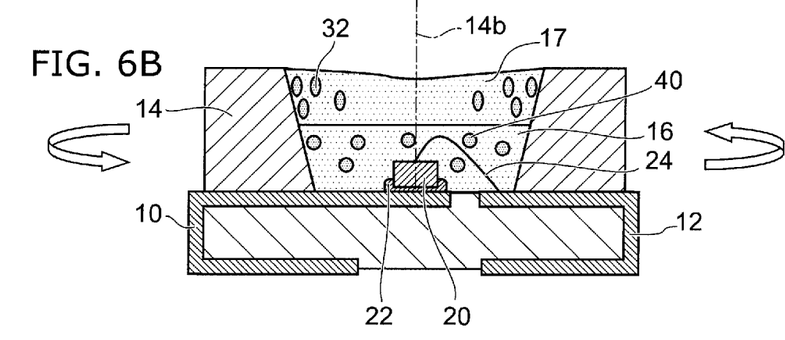
FIG. 6B is a schematic view of forming a second sealing layer.

FIG. 6A is a schematic view of forming a first sealing layer. FIG. 6B is a schematic view of forming a second sealing layer.

As shown in FIG. 6A, in the recess 14a, the light emitting element 20 and the bonding wire 24 are covered with a first transparent resin mixed with phosphor particles 40. Then, heat curing is performed to form a first sealing layer 16 dispersed with the phosphor particles 40.

Subsequently, as shown in FIG. 6B, in the recess 14a, a third transparent resin in liquid form mixed with fillers 32 is applied onto the first sealing layer 16. The package of the light emitting element 20 is rotated about its central axis 14b so that the fillers 32 are dispersed in a desired distribution. Then, heat curing is performed. Thus, a second sealing layer 17 having a refractive index profile as shown in FIG. 4C can be formed.

Figure 7:
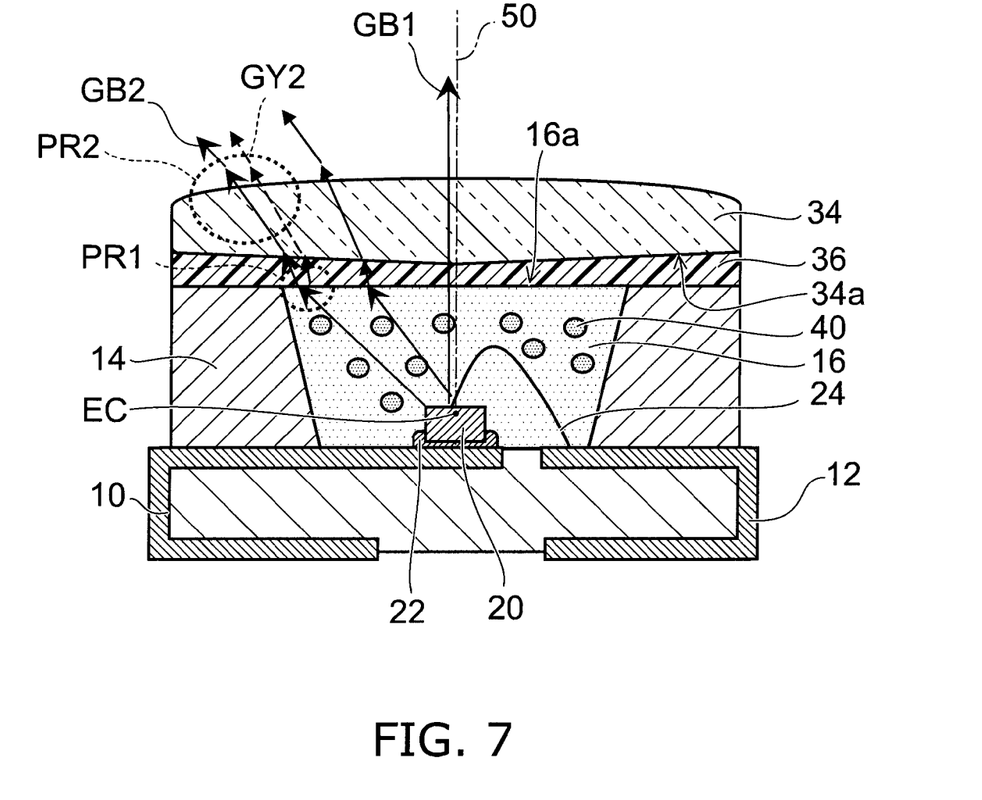
FIG. 7 is a schematic cross-sectional view of a light emitting device according to a third embodiment.

FIG. 7 is a schematic cross-sectional view of a light emitting device according to a third embodiment.

The light emitting device includes a first lead 10, a second lead 12, a molded body 14 made of e.g. thermoplastic resin, a light emitting element 20 bonded to the first lead 10, a first sealing layer 16 provided in a recess 14a of the molded body 14 and including a first transparent resin, phosphor particles 40 dispersed in the first sealing layer 16, a converging lens 34 covering the first sealing layer 16, and a transparent bonding resin layer 36. The upper surface 16a of the first sealing layer 16 and the lower surface 34a of the converging lens 34 are bonded to the bonding resin layer 36. The refractive index of the bonding resin layer 36 is higher than the refractive index $n_{t1}$ of the first transparent resin.

In the peripheral region PR1 of the upper portion of the first sealing layer 16, because the refractive index of the bonding resin layer 36 is higher than the refractive index $n_{t1}$ of the first transparent resin, blue light GB2 always travels into the bonding resin layer 36 at the upper surface 16a of the first sealing layer 16 and is refracted toward the optical axis 50. On the other hand, yellow phosphor particles 40 are widely dispersed in the recess 114a, and yellow light GY2 is emitted upward from the first sealing layer 16. The light once injected into the converging lens 34 is converged by the lens surface and emitted outside. That is, the outgoing direction of the blue light GB2 and the outgoing direction of the yellow light GY2 are made close. This facilitates reducing the chromaticity shift in the peripheral region PR2.

Furthermore, even if the thickness of the bonding resin layer 36 near the optical axis 50 is made smaller than the thickness of the bonding resin layer 36 near the peripheral region PR1, the refraction direction of the blue light GB2 in the peripheral region PR1 is not changed. That is, the lower surface 34a of the converging lens 34 may be convex downward.

Figure 8A:
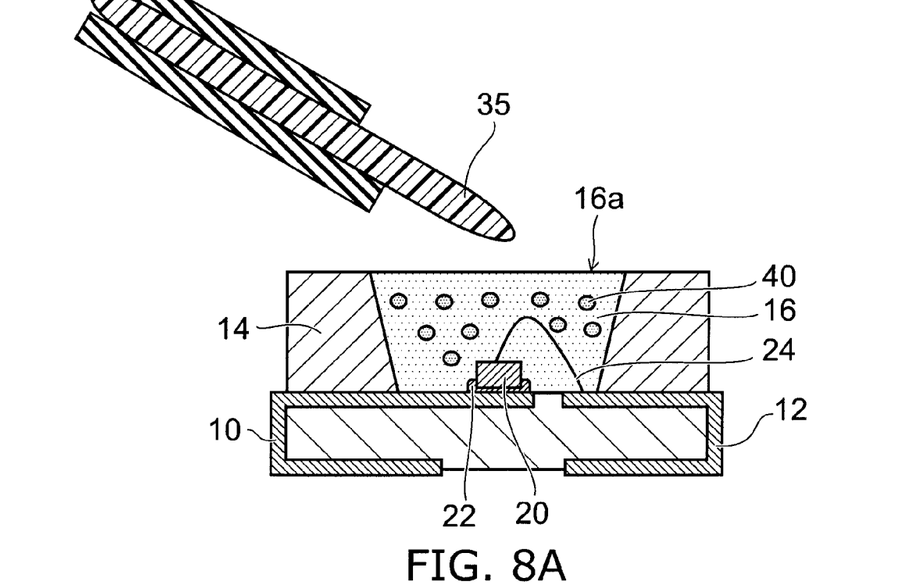
FIG. 8A is a schematic view of applying a liquid bonding resin.
Figure 8B:
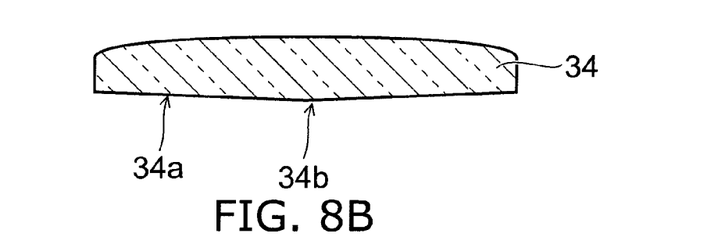
FIG. 8B is a schematic cross-sectional view of a converging lens.
Figure 8C:
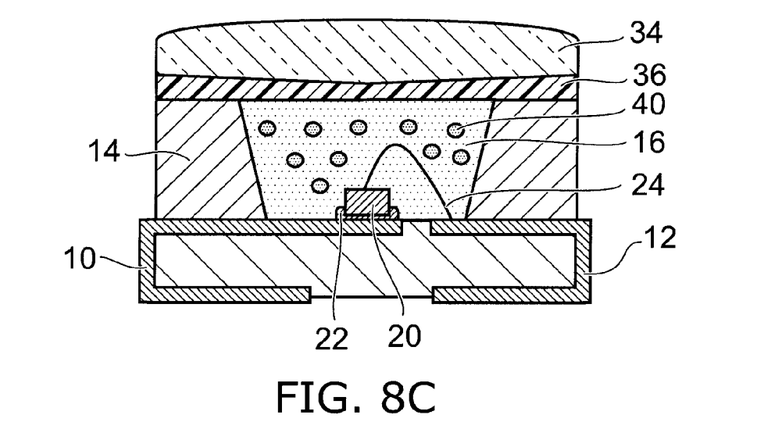
FIG. 8C is a schematic cross-sectional view with the converging lens bonded.

FIG. 8A is a schematic view of applying a liquid bonding resin. FIG. 8B is a schematic view of a converging lens. FIG. 8C is a schematic view with the converging lens bonded.

As shown in FIG. 8A, a prescribed amount of a liquid bonding resin 35 having a refractive index higher than the refractive index $n_{t1}$ of the first transparent resin is applied to the upper surface 16a of the first sealing layer 16 and the upper surface of the molded body 14.

A preshaped converging lens 34 is pressed to the upper surface of the applied bonding resin 35. In this case, if the lower surface 34a of the converging lens 34 has a convex portion 34b, close contact is facilitated without producing a gap at the interface therebetween. Then, the bonding resin 35 is heat cured into a bonding resin layer 36.

In the embodiment, the bonding resin layer 36 has a high refractive index. Hence, blue light efficiently injected therein with reduced total reflection is easily made close toward the optical axis 50 by the converging lens 34. That is, the bonding resin layer 36 reduces leakage of blue light GB2 in the peripheral regions PR1, PR2. This suppresses the chromaticity shift in an oblique light outgoing direction having a large intersection angle with the optical axis 50. Zirconium dioxide and titanium oxide having high refractive index are difficult to use for a bonding layer. In contrast, a resin mixed with fillers can be used as a bonding resin layer 36. This facilitates bonding the lens and increasing the volume productivity of the light emitting device.

Figure 9:
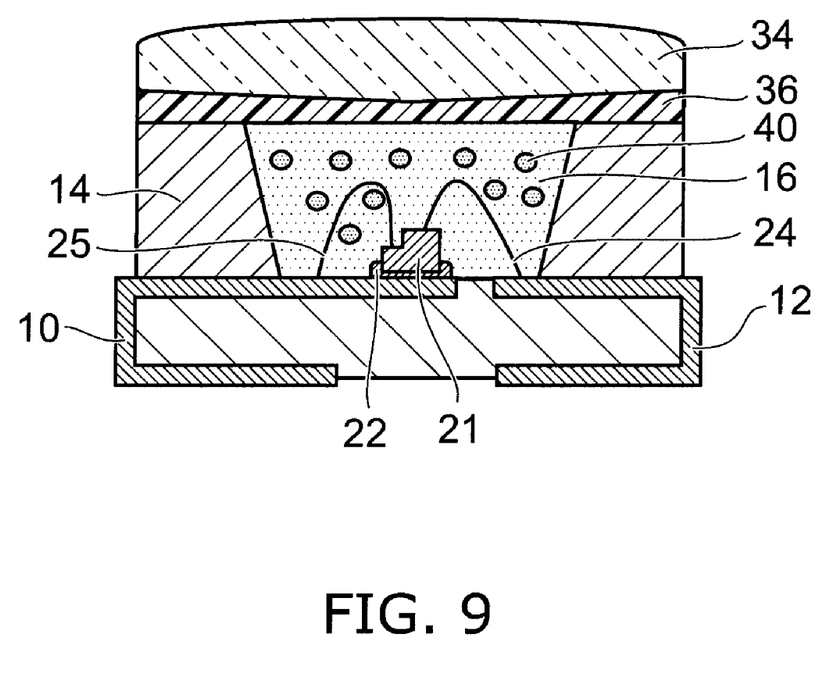
FIG. 9 is a schematic cross-sectional view of a light emitting device according to a variation of the third embodiment.

FIG. 9 is a schematic cross-sectional view of a light emitting device according to a variation of the third embodiment.

The light emitting element 21 includes e.g. a sapphire substrate, a stacked body including a first conductivity type layer, a light emitting layer, and a second conductivity type layer sequentially provided on the sapphire substrate, a lower electrode provided on the first conductivity type layer, and an upper electrode provided on the second conductivity type layer. The back surface side of the light emitting element 21 is bonded to the first lead 10. The lower electrode and the first lead 10 are connected by a bonding wire 25. The upper electrode and the second lead 12 are connected by a bonding wire 24. Such a light emitting element 21 can be used also in the first and second embodiment.

Thus, the first to third embodiments and the variations associated therewith provide a light emitting device easily reducing the chromaticity shift in a light outgoing direction having a large intersection angle with the optical axis. Such a light emitting device can be widely used in various illumination devices, display devices, traffic signals and the like to improve the luminous intensity shift and color rendition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light emitting device comprising:
   a light emitting element having a first surface and a second surface opposite to the first surface, with an optical axis of emission light being perpendicular to the second surface;
   a molded body including a recess, the first surface side of the light emitting element being disposed in the recess;
   a first sealing layer covering the light emitting element in the recess and including a first transparent resin and phosphor particles; and
   a converging lens provided on an upper surface of the first sealing layer and having a refractive index increasing with increase of distance from the optical axis, the refractive index at a position in contact with an outer edge of the upper surface of the first sealing layer being higher than a refractive index of the first transparent resin.

2. The device according to claim 1, wherein the converging lens is convex upward.

3. The device according to claim 1, wherein
   the converging lens includes a second transparent resin having a refractive index higher than the refractive index of the first transparent resin, and fillers having a refractive index higher than the refractive index of the second transparent resin; and
   the fillers are dispersed in the second transparent resin so that weight composition ratio increases with the increase of the distance from the optical axis.

4. The device according to claim 3, wherein the refractive index of the converging lens is equal to the refractive index of the second transparent resin on the optical axis.

5. The device according to claim 3, wherein the fillers are dispersed in the second transparent resin so that weight composition ratio increases with the increase of the distance from the optical axis.

6. The device according to claim 3, wherein the fillers are made of one of zirconium dioxide, titanium oxide, and potassium titanate.

7. The device according to claim 1, wherein reflective fillers are dispersed in the molded body.

8. The device according to claim 1, wherein
   the converging lens includes a glass having a refractive index higher than the refractive index of the first transparent resin, and fillers having a refractive index higher than the refractive index of the glass, and
   the fillers are dispersed in the glass so that weight composition ratio increases with the increase of the distance from the optical axis.

9. A light emitting device comprising:
   a light emitting element having a first surface and a second surface opposite to the first surface, with an optical axis of emission light being perpendicular to the second surface;
   a molded body including a recess, the first surface side of the light emitting element being disposed in the recess;
   a lead exposed at a bottom surface of the recess;
   a bonding wire connecting the light emitting element and the lead;
   a first sealing layer covering the light emitting element in the recess and including a first transparent resin and phosphor particles; and
   a second sealing layer provided on the first sealing layer in the recess and including a third transparent resin, a refractive index of the second sealing layer increasing with increase of distance from the optical axis, and the refractive index on a side in contact with the molded body being higher than a refractive index of the molded body.

10. The device according to claim 9, wherein
    the second sealing layer further includes fillers having a refractive index higher than a refractive index of the third transparent resin, and
    the fillers are dispersed in the second sealing layer so that weight composition ratio increases with the increase of the distance from the optical axis.

11. The device according to claim 10, wherein the refractive index of the third transparent resin is more than or equal to a refractive index of the first transparent resin.

12. The device according to claim 10, wherein the fillers are made of one of zirconium dioxide, titanium oxide, and potassium titanate.

13. The device according to claim 9, wherein reflective fillers are dispersed in the molded body.

14. The device according to claim 9, wherein the first sealing layer covers the bonding wire.

15. A light emitting device comprising:
    a light emitting element having a first surface and a second surface opposite to the first surface, with an optical axis of emission light being perpendicular to the second surface;
    a molded body including a recess, the first surface side of the light emitting element is disposed in the recess;
    a first sealing layer covering the light emitting element in the recess and including a first transparent resin and phosphor particles;
    a converging lens having a convex portion in an upper surface; and
    a bonding resin layer bonding an upper surface of the first sealing layer and a lower surface of the converging lens and having a refractive index higher than a refractive index of the first transparent resin.

16. The device according to claim 15, wherein the lower surface of the converging lens is convex downward.

17. The device according to claim 15, wherein the bonding resin layer includes fillers having a refractive index higher than the refractive index of the first transparent resin.

18. The device according to claim 17, wherein the fillers are made of one of zirconium dioxide, titanium oxide, and potassium titanate.

19. The device according to claim 17, wherein the bonding resin layer includes the first transparent resin.

20. The device according to claim 15, wherein reflective fillers are dispersed in the molded body.

* * * * *